United States Patent
Sakurai

Patent Number: 5,558,711
Date of Patent: Sep. 24, 1996

[54] ELECTRODE FORMING METHOD FOR SURFACE ACOUSTIC WAVE DEVICE

[75] Inventor: Atsushi Sakurai, Nagaokakyo, Japan

[73] Assignee: Murata Manufacturing Co., Ltd., Japan

[21] Appl. No.: 349,310

[22] Filed: Dec. 5, 1994

[51] Int. Cl.$^6$ ............................................. C30B 25/06
[52] U.S. Cl. ............................. 117/84; 117/108; 117/928
[58] Field of Search .............................. 117/84, 108, 928

[56] References Cited

U.S. PATENT DOCUMENTS

| | | | |
|---|---|---|---|
| 4,710,283 | 12/1987 | Singh et al. | 204/298 |
| 4,944,961 | 7/1990 | Lu et al. | 427/38 |
| 5,152,864 | 10/1992 | Ieki et al. | 117/108 |
| 5,241,417 | 8/1993 | Sekiguchi | 359/586 |
| 5,262,361 | 11/1993 | Cho et al. | 117/108 |

FOREIGN PATENT DOCUMENTS

| | | |
|---|---|---|
| 0534354 | 3/1993 | European Pat. Off. . |
| 53-052251 | 5/1978 | Japan . |
| 5183373 | 7/1993 | Japan . |

OTHER PUBLICATIONS

The 14th Symposium on Ultrasonic Electronics, Dec. 7–9, 1993, pp. 243–244.

Jpn. Appl. Phys. vol. 33 (1994), "Epitaxialy Grown Aluminum Film on 36°–Rotated Y–Cut Lithium Tantalate for High–Power Surface Acoustic Wave Devices", Sakurai et al., pp. 3015–3017.

Japanese Journal of Applied Physics, Supplements, vol. 30, No. 1, 1991, Tokyo, Japan–pp. 176–178.

Xian–zheng et al., "Formation of Ag/Si and Al/Si Films by Ion Assisted Deposition", Vacuum vol. 39 No. 2–4, pp. 425–428, 1989.

Gamo et al., "Ion Beam Assisted Deposition of Metal Organic Films Using Focused Ion Beams", Jap. J. Applied Physics vol. 23, No. 5 May 1984 pp. L293–L295.

*Primary Examiner*—Robert Kunemund
*Attorney, Agent, or Firm*—Ostrolenk, Faber, Gerb & Soffen, LLP

[57] ABSTRACT

An electrode forming method for a surface acoustic wave device is adapted to form a film of an electrode material on a piezoelectric substrate to be crystallographically oriented in a constant direction while carrying out ion assistance at prescribed ion energy, in a film formation process employing a film forming method such as evaporation, sputtering, IBS (ion beam sputtering), CVD (chemical vapor deposition), plasma CVD, MBE (molecular beam epitaxy), ICB (ionized cluster beam) or laser ablation.

57 Claims, 6 Drawing Sheets

ELECTRODE FORMING METHOD FOR
SURFACE ACOUSTIC WAVE DEVICE

BACKGROUND OF THE INVENTION

1. Field of the Invention

The present invention relates to an electrode forming method for a surface acoustic wave device (hereinafter referred to as a SAW device), and more particularly, it relates to a method of forming electrodes on a piezoelectric substrate structuring a SAW device through a thin film forming method.

2. Description of the Background Art

A SAW device utilizing a surface acoustic wave, which is generally structured by forming an interdigital transducer made of comb electrodes and grating electrodes of metal strips on a surface of a substrate having piezoelectricity, is widely applied to a television receiver or a video tape recorder. A material for forming the electrodes of such a SAW device is generally prepared from aluminum (Al), ordinarily in the form of amorphous polycrystalline Al.

Further, the SAW device is widely applied to a transmission/receiving element or a resonator for a high frequency domain in recent years, and expected as a filter for a radio frequency band pass filter of a portable device for mobile communication, for the purpose of miniaturization and weight reduction.

Such a SAW device is used at a low applied power level of about 1 mW when the same is applied to a television receiver or a video tape recorder, while a high voltage level signal is applied to a SAW device which is employed for mobile communication, particularly for the purpose of transmission. For example, extremely high power of about 20 mW is applied to a SAW filter for a cordless telephone (The 14th Symposium with respect to the fundamentals and applications of ultrasonic electronics on Dec. 9, 1993 held in Japan). Therefore, high stress which is caused by a surface acoustic wave is applied to the electrodes (Al electrodes), to result in migration in the electrodes. Such migration resulting from stress is called stress migration. This stress migration causes electrical shorting, increase in insertion loss and reduction in quality factor of the resonator, leading to reduction in performance of the SAW device.

In order to solve this problem, there has been proposed a SAW device employing as an electrode material an Al film or an Al alloy (e.g., Al-Cu alloy) film whose (111) plane is parallel to the substrate surface and the orientation axis is [111] (Japanese Patent Laying-Open No. 5-183373 (1993)).

In the aforementioned Al film or Al alloy film whose (111) plane is parallel to the substrate surface, however, resistance against stress migration is improved but this effect is not necessarily sufficient. Under the present circumstances, therefore, awaited is an electrode forming method which enables formation of electrodes having higher resistance against stress migration.

SUMMARY OF THE INVENTION

In order to solve the aforementioned problem, an object of the present invention is to provide an electrode forming method for a SAW device which enables formation of electrodes exhibiting excellent stress migration resistance also when high power is applied thereto.

In order to attain the aforementioned object, the inventors have made various studies on stress migration of electrodes, considered that a number of irregularities in crystal structure are caused when substrate crystals and metal crystals remarkably misfit with each other to result in stress migration caused by surface acoustic waves in the conventional Al film whose crystal orientation is along the (111) plane, and made further experiments and studies, to complete the present invention.

The inventive electrode forming method for a SAW device comprises the steps of preparing a piezoelectric substrate, and forming a film of an electrode material on the piezoelectric substrate to be oriented in a constant direction by a thin film forming method while carrying out ion assistance at prescribed ion energy. The thin film forming method can be selected from various methods such as sputtering, IBS (ion beam sputtering), CVD (chemical vapor deposition), plasma CVD, MBE (molecular beam epitaxy), ICB (ionized cluster beam) and laser ablation, while the method is not restricted to these but can be implemented by a further method.

It is possible to form an epitaxial film having an extremely small number of crystal defects by forming a film of the electrode material on the piezoelectric substrate to be crystallographically oriented in a constant direction while carrying out ion assistance in a film forming process employing an arbitrary thin film forming method as hereinabove described, thereby forming electrodes having superior durability which are excellent in stress migration resistance.

In the inventive electrode forming method for a SAW device, the film of the electrode material as formed preferably is oriented so that the (111) plane of the film is parallel to the substrate surface, for the following reason:

Electrodes having (111) orientation are closest packing layers having no irregularities of atomic arrangement in the electrode planes. Thus, it is possible to uniformly disperse stress as applied over the electrodes, thereby improving stress migration resistance. Further, as there is no crystal boundary and thus there is little crystal defects, it is possible to restrain the diffusion due to the diffusion in the crystal boundaries and the crystal defects.

The ion assistance is preferably carried out at ion energy of 200 to 1000 eV.

It is impossible to supply sufficient energy to the metal atoms if the ion energy is less than 200 eV, while an effect of sputtering the metal atoms with assistant ions is so excessively increased that no film growth is attained if the energy exceeds 1000 eV.

Further, the ion assistance is preferably carried out with an assistant ion current of 0.01 to 10.00 mA/cm$^2$ in current density.

It is impossible to supply sufficient energy to the metal atoms if the current density of the assistant current is less than 0.01 mA/cm$^2$, while the effect of sputtering the metal atoms with the assistant ions is so excessively increased that no film growth is attained if the current density exceeds 10.00 mA/cm$^2$.

Further, the assistant ions are preferably prepared from at least one of He$^+$, Ne$^+$, Ar$^+$, Kr$^+$ and Xe$^+$.

It is possible to attain a sufficient ion assistance effect by employing such assistant ions, thereby reliably forming an epitaxial film having an extremely small number of crystal defects. Further, since the assist ions are ions of inert gasses, they can provide energy without reacting with the metal atom or atoms consisting the substrate.

The assistant ions are preferably incident upon the substrate at an angle of 0° to 60° to a normal line with respect to the substrate surface.

If the angle of incidence is out of this range, it is impossible to efficiently supply energy to the metal atoms.

It is preferable to set the film forming rate in the range of 0.1 to 50 Å/sec.

The metal atoms disadvantageously condense to cause crystal grain growth if the film forming rate is not more than 0.1 Å/sec., while the film is disadvantageously formed before the metal atoms are regularly arranged.

A substrate heating temperature in film formation is preferably 0° to 400° C., since proper migration of the metal atoms is required on the substrate surface for epitaxial growth.

Further, the film formation is preferably carried out at a degree of vacuum of not more than $10^{-3}$ mmHg, so that no residual gas is incorporated in the film to irregularize the crystal structure.

The electrode material is preferably prepared from a metal having a face centered cubic structure such as Al, or a metal having a face centered cubic structure and containing an additive, due to the closest structure along the (111) plane. It is possible to prepare the metal having a face centered cubic structure from Ag, Au or Ni, in place of Al.

The additive is preferably prepared from at least one of Ti, Cu and Pd, with an amount in the range of 0.1 to 5.0 percent by weight.

It is possible to further improve stress migration resistance by adding at least one of Ti, Cu and Pd. However, the effect of addition is hardly recognized if the amount of this additive is less than 0.1 percent by weight, while resistivity is increased if the amount exceeds 5.0 percent by weight. Thus, the additive is preferably added in the range of 0.1 to 5.0 percent by weight.

The piezoelectric substrate is preferably formed by a substrate consisting of at least one of quart, $LiTaO_3$, $LiNbO_3$, $Li_2B_4O_7$ and ZnO, since the density of the oxygen atom is high on the surface of the crystal, particularly quart, $LiTaO_3$ and $LiNbO_3$ has the closest packing structure, so that the effects due to the atom arrangements of the substrate is readily given to the metal atoms.

In the inventive electrode forming method for a SAW device, as hereinabove described, a film of the electrode material is formed on the piezoelectric substrate to be crystallographically oriented in a constant direction with ion assistance at prescribed energy in a film forming process employing an arbitrary thin film forming method, whereby it is possible to form an epitaxial film having an extremely small number of crystal defects thereby forming electrodes which are excellent in stress migration resistance.

Further, the electrodes which are formed by the inventive method are excellent in electromigration resistance and thermal stability as well as workability in wet etching, due to the extremely small number of crystal defects.

Further, an interface between the substrate and the electrode (film) is extremely stabilized and forms no alloy, whereby it is possible to prevent reduction of resistance (IR) across the electrodes.

In the electrode forming method for a SAW device according to the present invention, further, it is possible to obtain an epitaxial film also when the misfit between the substrate crystals and the metal film crystals are at least ±20%, due to the employment of the ion assistance in the film forming process.

In addition, an epitaxial film having an extremely small number of crystal defects can be obtained also when the ratio of the additive is increased, whereby it is possible to further improve stress migration resistance by adding the additive in a sufficient ratio.

According to the inventive electrode forming method for a SAW device, further, it is possible to form electrodes at a low temperature, thereby reducing damage (wafer damage) on the piezoelectric substrate in formation of the electrodes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
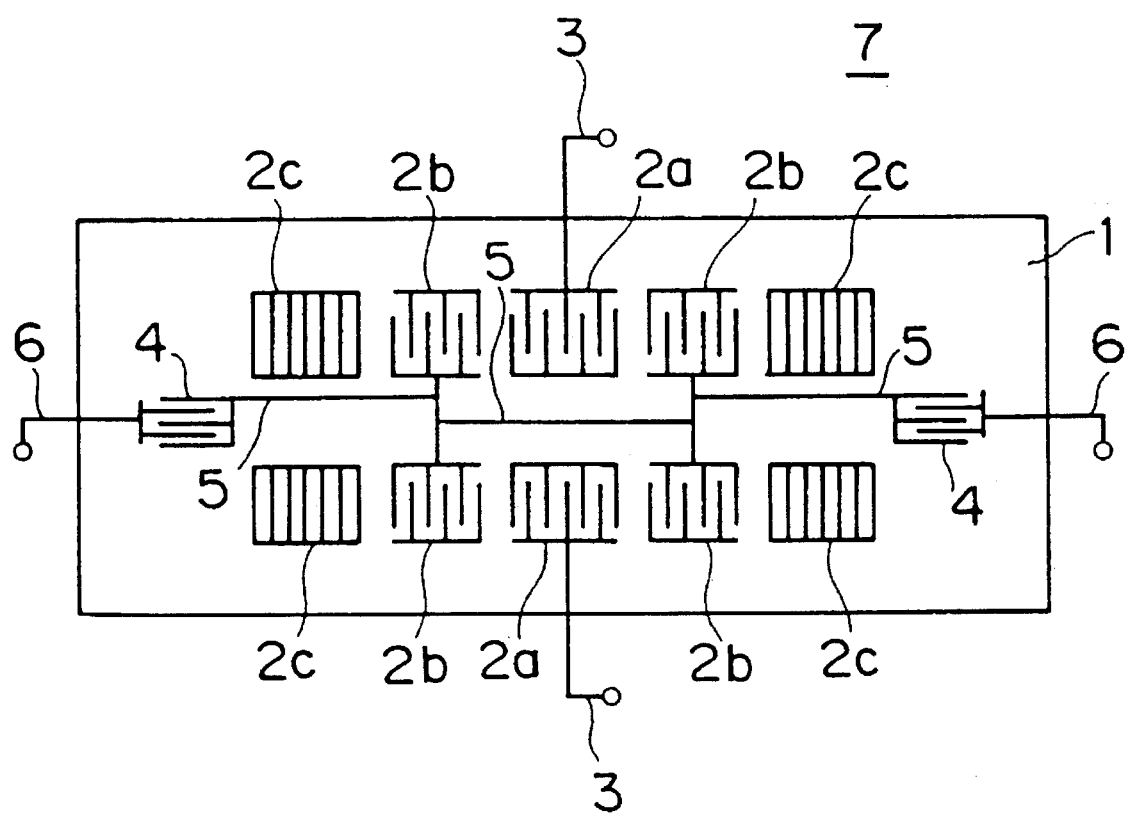
FIG. 3 is a plan view showing a SAW device (double-mode surface acoustic wave filter) having electrodes formed by the inventive electrode forming method for a SAW device.

An embodiment of the present invention is now described to explain the feature of the present invention in detail. FIG. 3 is a plan view showing a SAW device (double-mode surface acoustic wave filter) 7 having electrodes which are formed by the inventive electrode forming method.

In the double-mode SAW filter 7 shown in FIG. 3, a vertical pair of interdigital electrodes 2a are formed on a central portion of a surface of a piezoelectric substrate 1, while interdigital electrodes 2b are formed on both sides thereof respectively. Further, grating electrodes (reflectors) 2c are provided on both sides of the interdigital electrodes 2b respectively.

Outside the grating electrodes 2c, capacitive electrodes 4 having comb shapes are formed on intermediate portions. Further, lead terminals 3 are drawn out from the interdigital electrodes 2a through wires. The interdigital electrodes 2b are connected with each other by wiring patterns 5, and further connected with the capacitive electrodes 4 by additional wiring patterns 5, to be provided with capacitances. Further, lead terminals 6 are drawn out from the capacitive electrodes 4.

A practical method which was employed for forming the electrodes of the aforementioned SAW device is now described.

A piezoelectric substrate 1 consisting of LiTaO$_3$ was prepared first to form an Al film (electrode film) of 2000Å in thickness over one major surface of the piezoelectric substrate 1 by dual ion beam sputtering, while carrying out ion assistance.

Figure 1:
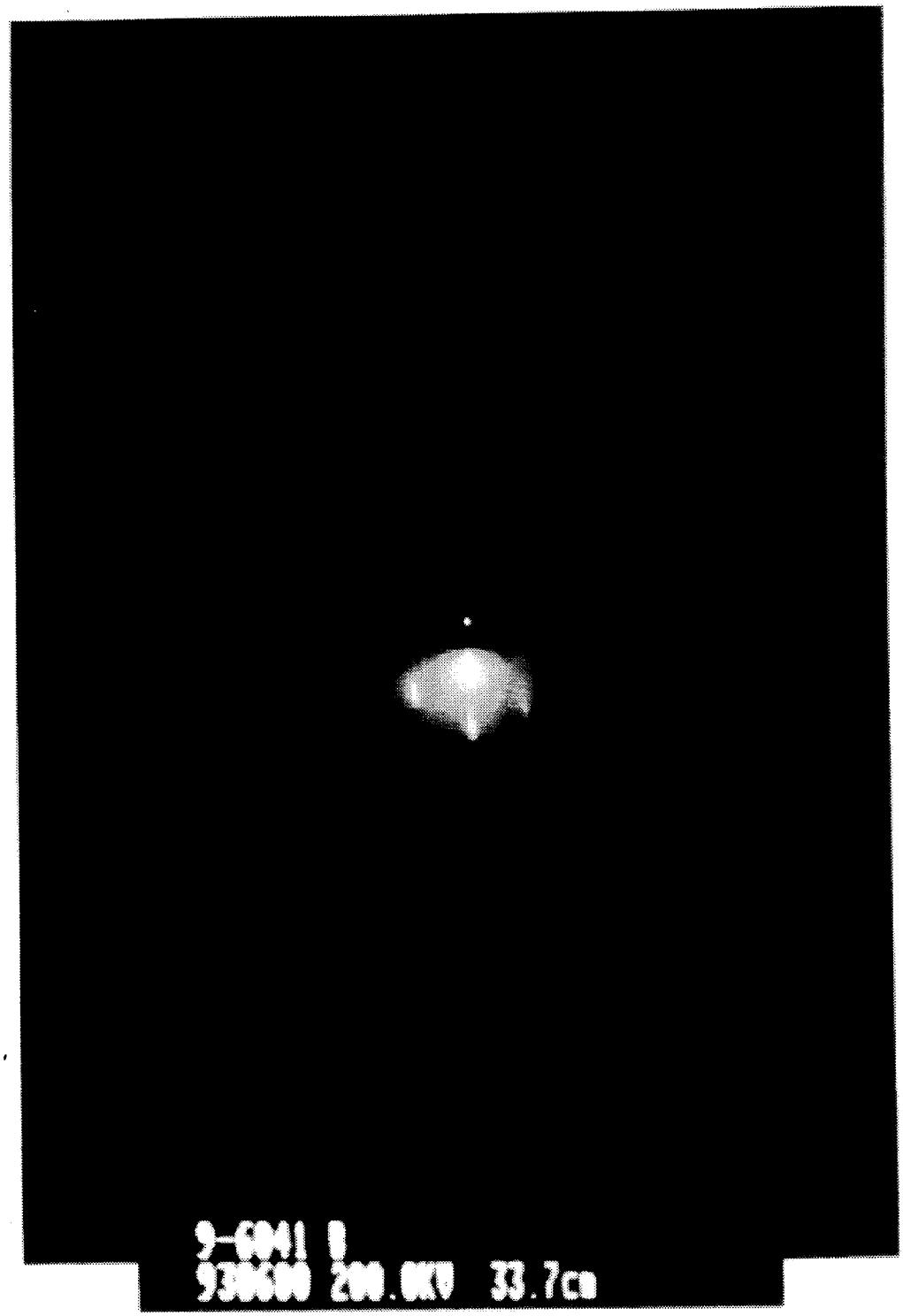
FIG. 1 is a RHEED photograph showing the crystal structure of a (111)-oriented epitaxial Al film (epitaxial Al film) formed on an $LiTaO_3$ substrate by a method according to Example of the present invention.
Figure 7:
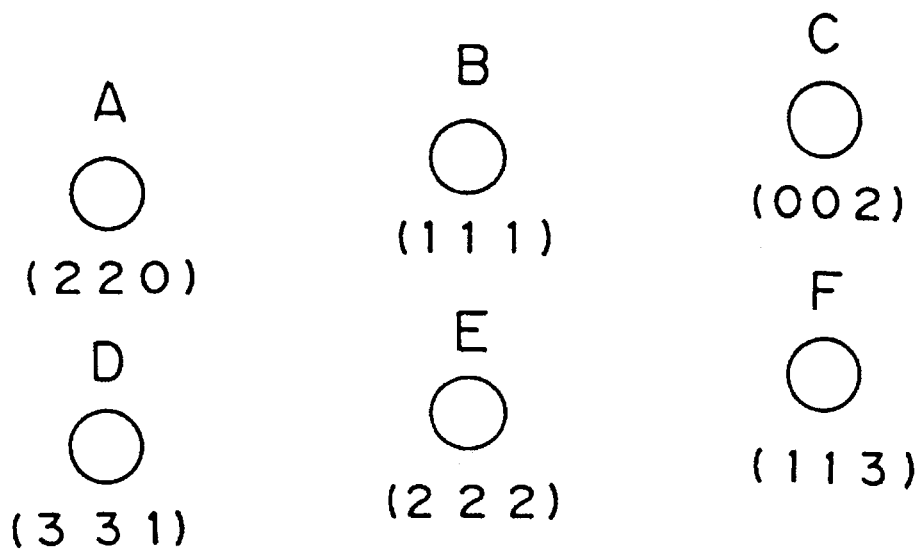
FIG. 7 is a drawing for explaining FIG. 1 and shows surface index of the respective diffraction spots.

At this time, the following film forming conditions were employed:

Sputtering Ion Current: 100 mA
Sputtering Ion Energy: 1000 eV
Type of Assistant Ions: Ar$^+$
Assistant Ion Current: 50 mA
Assistant Ion Current Density: 5 mA/cm$^2$
Assistant Ion Energy: 300 eV
Angle of Incidence of Assistant Ions: 15°
Substrate Temperature: 100° C.
Film Forming Rate: 2 Å/sec.
Degree of Vacuum in Film Formation: 5×10$^{-5}$ mmHg FIG. 1 is a RHEED photograph showing the crystal structure of the electrode film (epitaxial Al film) which was formed on the piezoelectric substrate 1 consisting of LiTaO$_3$. FIG. 7 is a drawing for explaining FIG. 1 and shows surface index of the respective diffraction spots. As seen from FIG. 7, the crystal is epitaxially grown on the (111) plane.

Figure 2:
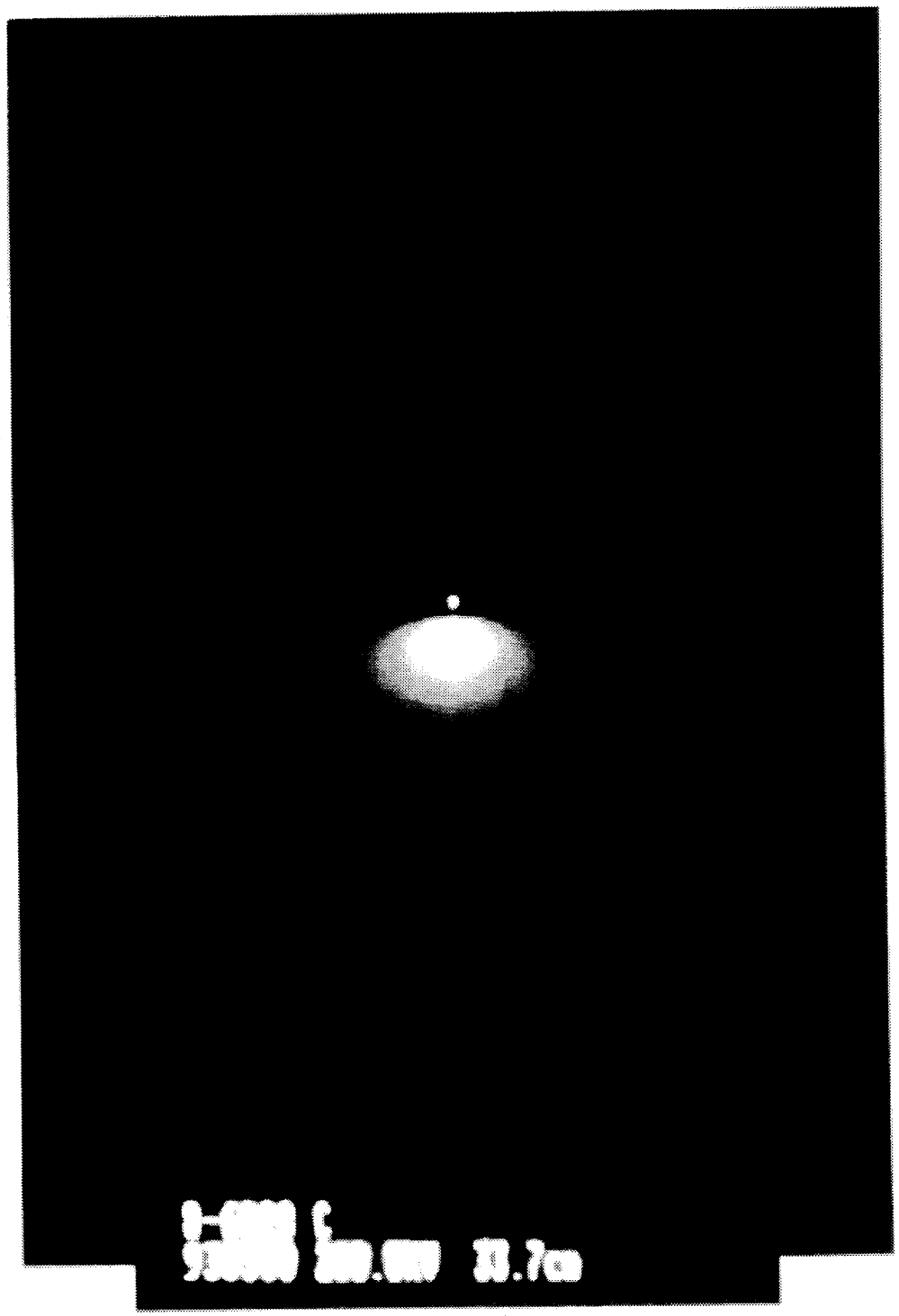
FIG. 2 is a RHEED photograph showing the crystal structure of a (111)-oriented epitaxial Al film formed by a conventional method employing no ion assistance.

FIG. 2 is a RHEED photograph showing the crystal structure of an electrode film which was formed by a conventional method with no ion assistance.

It is understood from FIGS. 1 and 2 that the electrode film, which was obtained by forming a film of the electrode material on the piezoelectric substrate 1 by the inventive electrode forming method for a SAW device at prescribed ion energy while carrying out ion assistance, was an Al film ((111)-oriented epitaxial Al film) having an extremely small number of crystal defects which was epitaxially grown on the (111) plane, and had a superior crystal state as compared with the Al film which was formed with no ion assistance.

It was possible to confirm that this Al film has the following epitaxial relation by analyzing the RHEED pattern:

(111)[101]Al//(012)[100]LiTaO$_3$

Then, the Al film which was formed over one major surface of the piezoelectric substrate 1 was worked by photolithography for forming interdigital electrodes 2a and 2b, grating electrodes 2c, capacitive electrodes 4 and wiring patterns 5 on the surface of the piezoelectric substrate 1 respectively, thereby preparing a sample of the double-mode SAW filter 7 shown in FIG. 3.

Figure 4:
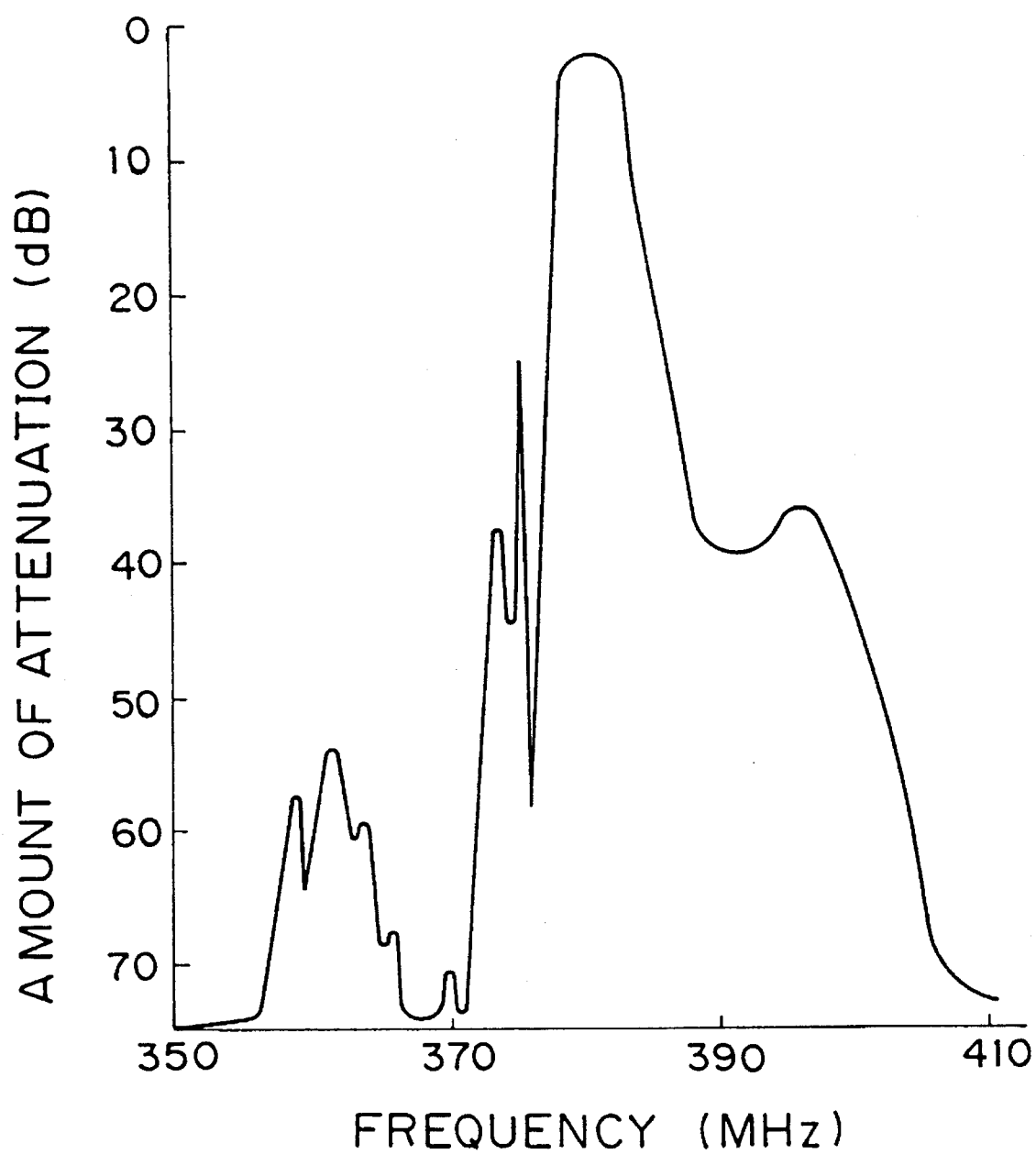
FIG. 4 illustrates a 50 Ω transmission characteristic of a double-mode surface acoustic wave filter having electrodes formed by the inventive electrode forming method for a SAW device.

The 50 Ω transmission characteristic of this double-mode SAW filter 7 was measured to obtain a characteristic curve shown in FIG. 4. Referring to FIG. 4, the axis of abscissas shows signal frequencies, and the axis of ordinates shows attenuation of signals passing through the SAW filter 7. As shown in FIG. 4, this characteristic curve has a peak frequency of about 380 MHz, with insertion loss of about 2.5 dB at the peak frequency.

Figure 5:
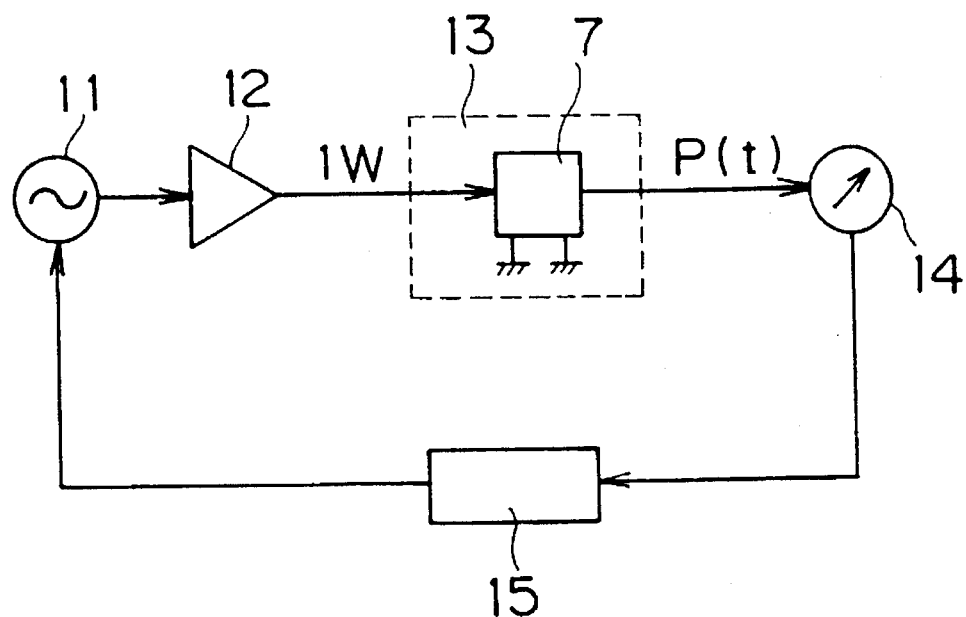
FIG. 5 schematically illustrates the structure of a stress migration resistance evaluation system.

A system shown in FIG. 5 was employed to evaluate power resistance (stress migration resistance) of the double-mode SAW filter 7.

In this system, an output signal of 1 W from an oscillator 11 is power-amplified in a power amplifier 12, so that the output is applied to the SAW filter 7. Then, an output P(t) of the SAW filter 7 is inputted in a power meter 14 and subjected to level measurement. An output of the power meter 14 is fed back to the oscillator 11 through a computer 15, so that the frequency of the applied signal is regularly identical to the peak frequency of the transmission characteristic. Further, the SAW filter 7 is stored in a thermostat 13 to be so heated that deterioration thereof is accelerated. In the aforementioned evaluation, the atmosphere temperature was kept at 85° C., to accelerate deterioration.

The output of the power amplifier 12 was set at 1 W (50 Ω system) and an initial output level P(t)=P$_0$ was measured, to decide that the SAW filter 7 reached the end of its life td when the output P(t) reached the following level after a lapse of a prescribed time t:

$$P(t) \geq P_0 - 1.0 \text{ (dB)}$$

Figure 6:
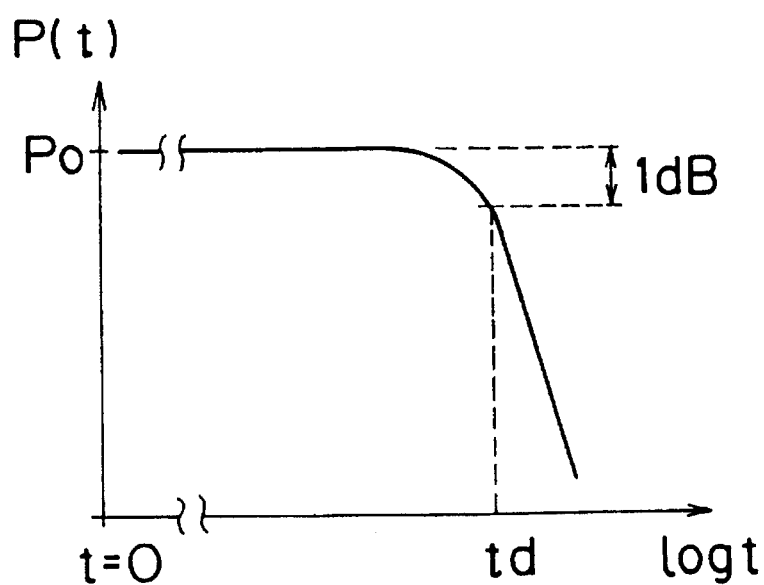
FIG. 6 is a diagram for illustrating a method of deciding the life of a SAW filter from its output.

It was inferred as being reasonable to estimate that the SAW filter 7 reaches the end of its life when the output P(t) is reduced by 1 dB, since the output P(t) and the time t are generally in relation shown in FIG. 6.

Samples A, B, C and D for the above evaluation were prepared by forming electrodes of the same shapes on the same LiTaO$_3$ substrates through the following four types of electrode materials (metals):

A: pure Al+1 wt. % Cu electrode of random orientation (conventional electrode)

B: epitaxial pure Al electrode of (111) orientation (conventional electrode)

C: epitaxial pure Al electrode of (111) orientation (inventive electrode)

D: epitaxial Al+1 wt. % Cu electrode of (111) orientation (inventive electrode)

As the result of the experiment, it was confirmed that the respective samples had the following lives:

A: not more than 8 hours
B: 1750 hours
C: 2800 hours
D: at least 3200 hours

It is understood from the above that the life of the sample B having electrodes which were prepared from the pure Al film, oriented along the (111) plane, by the conventional method employing no ion assistance was about 200 times that of the sample A having conventional electrodes, while the life of the sample C having electrodes which were prepared from the epitaxial pure Al film with ion assistance was about 350 times, with further remarkable improvement in durability. It is also understood that the life was further increased in the sample D having electrodes which were prepared from the epitaxial Al alloy film consisting of Al and Cu as compared with the sample C having the electrodes which were prepared from the epitaxial pure Al film.

While the above embodiment has been described with reference to Cu serving as an additive for Al, the additive to be added to Al for attaining the effect of the long life in the inventive electrode forming method for a SAW device is not restricted to Cu but a similar effect can be attained also when Ti or Pd is employed as the additive.

While dual ion beam sputtering is employed as the thin film forming method with ion assistance in the aforementioned embodiment, the thin film forming method can alternatively be selected from various methods such as vapor-evaporation, sputtering, CVD, plasma CVD, MBE, ICB and laser ablation, to attain an effect similar to that of the aforementioned embodiment with ion assistance.

The present invention is not restricted to the above embodiment also in other points, but various applications or modifications can be employed within the scope of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming electrodes of a surface acoustic wave device, said method comprising the steps of:

preparing a piezoelectric substrate; and forming an epitaxial film of an electrode material on a surface of said piezoelectric substrate such that a (111) plane of the epitaxial film is oriented so as to be substantially parallel to said surface of said piezoelectric substrate by an epitaxial thin film forming method while simultaneously carrying out ion assistance at an ion energy.

2. The electrode forming method for a surface acoustic wave device in accordance with claim 1, wherein said ion assistance is carried out at ion energy of 200 to 1000 eV.

3. The electrode forming method for a surface acoustic wave device in accordance with claim 1, wherein said ion assistance is carried out with an assistant ion current of 0.01 to 10.00 mA/cm² in current density.

4. The electrode forming method for a surface acoustic wave device in accordance with claim 1, wherein assistant ions are prepared from at least one of $He^+$, $Ne^+$, $Ar^+$, $Kr^+$ and $Xe^+$.

5. The electrode forming method for a surface acoustic wave device in accordance with claim 1, wherein said assistant ions are incident upon said substrate at an angle in the range of 0° to 60° with respect to a normal line of a surface of said substrate.

6. The electrode forming method for a surface acoustic wave device in accordance with claim 1, wherein a film forming rate is 0.1 to 50 Å/sec.

7. The electrode forming method for a surface acoustic wave device in accordance with claim 1, wherein a substrate heating temperature in film formation is 0° to 400° C.

8. The electrode forming method for a surface acoustic wave device in accordance with claim 1, wherein a degree of vacuum in film formation is not more than $10^{-3}$ mmHg.

9. The electrode forming method for a surface acoustic wave device in accordance with claim 1, wherein said electrode material is a metal having a face centered cubic structure such as Al, or a metal having a face centered cubic structure containing an additive.

10. The electrode forming method for a surface acoustic wave device in accordance with claim 9, wherein said additive is at least one of Ti, Cu and Pd, and added in an amount of 0.1 to 5.0 percent by weight.

11. The electrode forming method for a surface acoustic wave device in accordance with claim 1, wherein said piezoelectric substrate consists of at least one of rock crystal, $LiTaO_3$, $LiNbO_3$, $Li_2B_4O_7$ and ZnO.

12. The electrode forming method for a surface acoustic wave device in accordance with claim 1, wherein said ion assistance is carried out at ion energy of 200 to 1000 eV.

13. The electrode forming method for a surface acoustic wave device in accordance with claim 1, wherein said ion assistance is carried out with an assistant ion current of 0.01 to 10.00 mA/cm² in current density.

14. The electrode forming method for a surface acoustic wave device in accordance with claim 2, wherein said ion assistance is carried out with an assistant ion current of 0.01 to 10.00 mA/cm² in current density.

15. The electrode forming method for a surface acoustic wave device in accordance with claim 1, wherein assistant ions are prepared from at least one of $He^+$, $Ne^+$, $Ar^+$, $Kr^+$ and $Xe^+$.

16. The electrode forming method for a surface acoustic wave device in accordance with claim 2, wherein assistant ions are prepared from at least one of $He^+$, $Ne^+$, $Ar^+$, $Kr^+$ and $Xe^+$.

17. The electrode forming method for a surface acoustic wave device in accordance with claim 3, wherein assistant ions are prepared from at least one of $He^+$, $Ne^+$, $Ar^+$, $Kr^+$ and $Xe^+$.

18. The electrode forming method for a surface acoustic wave device in accordance with claim 1, wherein said assistant ions are incident upon said substrate at an angle in the range of 0° to 60° with respect to a normal line of a surface of said substrate.

19. The electrode forming method for a surface acoustic wave device in accordance with claim 2, wherein said assistant ions are incident upon said substrate at an angle in the range of 0° to 60° with respect to a normal line of a surface of said substrate.

20. The electrode forming method for a surface acoustic wave device in accordance with claim 3, wherein said assistant ions are incident upon said substrate at an angle in the range of 0° to 60° with respect to a normal line of a surface of said substrate.

21. The electrode forming method for a surface acoustic wave device in accordance with claim 4, wherein said assistant ions are incident upon said substrate at an angle in the range of 0° to 60° with respect to a normal line of a surface of said substrate.

22. The electrode forming method for a surface acoustic wave device in accordance with claim 1, wherein a film forming rate is 0.1 to 50 Å/sec.

23. The electrode forming method for a surface acoustic wave device in accordance with claim 2, wherein a film forming rate is 0.1 to 50 Å/sec.

24. The electrode forming method for a surface acoustic wave device in accordance with claim 3, wherein a film forming rate is 0.1 to 50 Å/sec.

25. The electrode forming method for a surface acoustic wave device in accordance with claim 4, wherein a film forming rate is 0.1 to 50 Å/sec.

26. The electrode forming method for a surface acoustic wave device in accordance with claim 5, wherein a film forming rate is 0.1 to 50 Å/sec.

27. The electrode forming method for a surface acoustic wave device in accordance with claim 1, wherein a substrate heating temperature in film formation is 0° to 400° C.

28. The electrode forming method for a surface acoustic wave device in accordance with claim 2, wherein a substrate heating temperature in film formation ms 0° to 400° C.

29. The electrode forming method for a surface acoustic wave device in accordance with claim 3, wherein a substrate heating temperature in film formation ms 0° to 400° C.

30. The electrode forming method for a surface acoustic wave device in accordance with claim 4, wherein a substrate heating temperature in film formation is 0° to 400° C.

31. The electrode forming method for a surface acoustic wave device in accordance with claim 5, wherein a substrate heating temperature in film formation ms 0° to 400° C.

32. The electrode forming method for a surface acoustic wave device in accordance with claim 6, wherein a substrate heating temperature in film formation ms 0° to 400° C.

33. The electrode forming method for a surface acoustic wave device in accordance with claim 1, wherein a degree of vacuum in film formation is not more than $10^{-3}$ mmHg.

34. The electrode forming method for a surface acoustic wave device in accordance with claim 2, wherein a degree of vacuum in film formation is not more than $10^{-3}$ mmHg.

35. The electrode forming method for a surface acoustic wave device in accordance with claim 3, wherein a degree of vacuum in film formation is not more than $10^{-3}$ mmHg.

36. The electrode forming method for a surface acoustic wave device in accordance with claim 4, wherein a degree of vacuum in film formation is not more than $10^{-3}$ mmHg.

37. The electrode forming method for a surface acoustic wave device in accordance with claim 5, wherein a degree of vacuum in film formation is not more than $10^{-3}$ mmHg.

38. The electrode forming method for a surface acoustic wave device in accordance with claim 6, wherein a degree of vacuum in film formation is not more than $10^{-3}$ mmHg.

39. The electrode forming method for a surface acoustic wave device in accordance with claim 7, wherein a degree of vacuum in film formation is not more than $10^{-3}$ mmHg.

40. The electrode forming method for a surface acoustic wave device in accordance with claim 1, wherein said electrode material is a metal having a face centered cubic structure such as Al, or a metal having a face centered cubic structure containing an additive.

41. The electrode forming method for a surface acoustic wave device in accordance with claim 2, wherein said electrode material is a metal having a face centered cubic structure such as Al, or a metal having a face centered cubic structure containing an additive.

42. The electrode forming method for a surface acoustic wave device in accordance with claim 3, wherein said electrode material is a metal having a face centered cubic structure such as Al, or a metal having a face centered cubic structure containing an additive.

43. The electrode forming method for a surface acoustic wave device in accordance with claim 4, wherein said electrode material is a metal having a face centered cubic structure such as Al, or a metal having a face centered cubic structure containing an additive.

44. The electrode forming method for a surface acoustic wave device in accordance with claim 5, wherein said electrode material is a metal having a face centered cubic structure such as Al, or a metal having a face centered cubic structure containing an additive.

45. The electrode forming method for a surface acoustic wave device in accordance with claim 6, wherein said electrode material is a metal having a face centered cubic structure such as Al, or a metal having a face centered cubic structure containing an additive.

46. The electrode forming method for a surface acoustic wave device in accordance with claim 7, wherein said electrode material is a metal having a face centered cubic structure such as Al, or a metal having a face centered cubic structure containing an additive.

47. The electrode forming method for a surface acoustic wave device in accordance with claim 8, wherein said electrode material is a metal having a face centered cubic structure such as Al, or a metal having a face centered cubic structure containing an additive.

48. The electrode forming method for a surface acoustic wave device in accordance with claim 1, wherein said piezoelectric substrate consists of at least one of rock crystal, $LiTaO_3$, $LiNbO_3$, $Li_2B_4O_7$ and ZnO.

49. The electrode forming method for a surface acoustic wave device in accordance with claim 2, wherein said piezoelectric substrate consists of at least one of rock crystal, $LiTaO_3$, $LiNbO_3$, $Li_2B_4O_7$ and ZnO.

50. The electrode forming method for a surface acoustic wave device in accordance with claim 3, wherein said piezoelectric substrate consists of at least one of rock crystal, $LiTaO_3$, $LiNbO_3$, $Li_2B_4O_7$ and ZnO.

51. The electrode forming method for a surface acoustic wave device in accordance with claim 4, wherein said piezoelectric substrate consists of at least one of rock crystal, $LiTaO_3$, $LiNbO_3$, $Li_2B_4O_7$ and ZnO.

52. The electrode forming method for a surface acoustic wave device in accordance with claim 5, wherein said piezoelectric substrate consists of at least one of rock crystal, $LiTaO_3$, $LiNbO_3$, $Li_2B_4O_7$ and ZnO.

53. The electrode forming method for a surface acoustic wave device in accordance with claim 6, wherein said piezoelectric substrate consists of at least one of rock crystal, $LiTaO_3$, $LiNbO_3$, $Li_2B_4O_7$ and ZnO.

54. The electrode forming method for a surface acoustic wave device in accordance with claim 7, wherein said piezoelectric substrate consists of at least one of rock crystal, $LiTaO_3$, $LiNbO_3$, $Li_2B_4O_7$ and ZnO.

55. The electrode forming method for a surface acoustic wave device in accordance with claim 8, wherein said piezoelectric substrate consists of at least one of rock crystal, $LiTaO_3$, $LiNbO_3$, $Li_2B_4O_7$ and ZnO.

56. The electrode forming method for a surface acoustic wave device in accordance with claim 9, wherein said piezoelectric substrate consists of at least one of rock crystal, $LiTaO_3$, $LiNbO_3$, $Li_2B_4O_7$ and ZnO.

57. The electrode forming method for a surface acoustic wave device in accordance with claim 10, wherein said piezoelectric substrate consists of at least one of rock crystal, $LiTaO_3$, $LiNbO_3$, $Li_2B_4O_7$ and ZnO.

* * * * *